United States Patent [19]

Gow, 3rd et al.

[11] Patent Number: 5,138,430
[45] Date of Patent: Aug. 11, 1992

[54] HIGH PERFORMANCE VERSATILE THERMALLY ENHANCED IC CHIP MOUNTING

[75] Inventors: John Gow, 3rd, Milton; Richard W. Noth, Fairfax, both of Vt.

[73] Assignee: International Business Machines Corporation, Armonk, N.Y.

[21] Appl. No.: 711,679

[22] Filed: Jun. 6, 1991

[51] Int. Cl.⁵ .................... H01L 23/48; H01L 21/28
[52] U.S. Cl. .................................. 357/70; 357/71; 357/72; 357/81; 437/207; 437/209; 437/217; 437/219
[58] Field of Search .............. 357/70, 71, 72, 81; 437/207, 209, 217, 219

[56] References Cited

U.S. PATENT DOCUMENTS

| | | | |
|---|---|---|---|
| 3,967,366 | 7/1976 | Birglechner et al. | 29/588 |
| 4,800,419 | 1/1989 | Long et al. | 357/70 |
| 4,835,120 | 5/1989 | Mallik et al. | 437/209 |
| 4,899,207 | 2/1990 | Hallowell et al. | 357/70 |
| 4,903,114 | 2/1990 | Aoki et al. | 357/70 |
| 4,916,506 | 4/1990 | Gagnon | 357/70 |

Primary Examiner—Edward J. Wojciechowicz
Attorney, Agent, or Firm—William N. Hogg; Francis J. Thornton

[57] ABSTRACT

According to the present invention, an improved chip and leadframe package assembly and method of making the same is provided. The package assembly is comprised of a metal leadframe having a chip bond pedestal centrally located and a plurality of discrete leads surrounding the pedestal. An I/C (integrated circuit) semiconductor chip is mounted on the pedestal, the chip having a plurality of connection or bonding pads disposed around the periphery. An interposer having a layer of dielectric material and discrete metal lines formed thereon is mounted on an apron of the chip bonding pedestal between the location of the chip and the inner discrete leads of the leadframe. Connections are provided between the bonding pads on the chip and the respective lines on the interposer and connections are also provided between the fingers and the respective lines on the leadframe. Additionally, the interposer also preferably includes at least one voltage bus line formed thereon having a portion adjacent at least one edge of the chip for connection of any of the chip bond pads thereto. Further, the pedestal also preferably includes radially extending conducting arms suitable for providing both electrical ground connection and a heat dissipation path.

28 Claims, 7 Drawing Sheets

HIGH PERFORMANCE VERSATILE THERMALLY ENHANCED IC CHIP MOUNTING

BACKGROUND OF THE INVENTION

1. Field of the Invention

This invention relates generally to the packaging of semiconductor chips on leadframes, and more particularly to plastic flat packages (PFP) for integrated circuit chips which packages have enhanced thermal conduction properties and a technique for improving the utilization of the contact pads on the chip to allow more versatility in the design of the function of the various connections on the chip.

The progress in the design and manufacture of integrated circuit chips has resulted in an increased number of circuits and functions which can be provided on any size chip, and hence a need for an increased number of bonding pads on the periphery of a chip of any given dimension for signal input/output (I/O), voltage, and grounding. As the number of these pads increases and the size of the pads decreases, it is increasingly difficult to provide reliable connections to the individual pads for the necessary signals or voltage levels or ground levels which must be supplied to the various circuits on the chip.

One conventional technique for packaging chips is by utilizing leadframes which have fingers radiating therefrom, which fingers surround a central portion of the leadframe on which the chip is mounted. The leadframe fingers can be directly attached to the bonding pads on the chip, but this becomes more and more difficult to accomplish as the size of the pads, as well as the spacing between the pads on the chips decreases with the attendant increase in the number of bonding pads available.

Hence, it has become conventional in many instances to terminate the lead fingers a distance from the chip to thereby provide a larger geometrical area for the termination location of the fingers, and connect the various fingers to the pads on the chip by means of various wire bonding techniques. In such a technique, conventionally a certain number of pads on the chip, which are the voltage level pads must be connected to fingers directly across from them to provide the necessary voltage, thereby requiring that a certain number of fingers be dedicated to the provision of the voltage level. Similarly, a certain number of the pads must be connected to ground level voltage which also requires a certain number of fingers on the leadframe to be connected to ground level Conventionally, these fingers which are connected to the voltage and to the ground level are interposed or interdigitated between the other fingers on the leadframe which other fingers provide the necessary input/output signals to the pads on the chip. Thus, with these conventional prior art techniques, a significant number of the leadframe fingers must be dedicated to either providing various voltage power levels or ground levels for the chips.

In addition to reducing the number of fingers dedicated to I/O signals, the use of interdigitated fingers for both voltage and signals may introduce unwanted induction in the signal lines with the resulting potential for creating errors in the signals. Moreover, even by spacing the ends of the fingers a distance from the edge of the chip, it is still difficult to provide the required number of fingers for contact because the distance that the wire interconnections can span between the chip and the fingers are limited, and thus the ends of the fingers cannot terminate at a distance too far from the edge of the chip for effective wire interconnection. This, coupled with the fact that the fingers must have certain minimum widths and spacing further adds to the problem of providing a sufficient number of interconnections for all of the pads on various chips.

Another problem encountered by package designers and chips designers is that even if a sufficient number of fingers can be provided at the proper distance from the chip, it is generally necessary that each finger be wired to a chip bond connection directly across from the finger, i.e. it is difficult to provide connections of pads to fingers which are not directly opposite therefrom because of the necessary crossing of wires can cause significant problems.

Frequently, a chip designer must design a predetermined PFP lead configuration where voltage and/or ground lead locations have been fixed. Most configurations do not have voltage ground programmability (i.e. allow for selection of lines for ground and/or voltage connections) and require chip redesign. U.S. Pat. No. 4,835,120 to Mallik, et al. is an exception to this which discloses the use of multilevel tape which in turn is bonded to a metal plate which mounts the chip. This requires three metal planes separated by insulators.

Japanese Kokai 56-76864, assigned to Stanley Denke K K, discloses a standard leadframe secured to a ceramic with a wiring pattern on the ceramic. This holds the fingers together with the ceramic to keep them from breaking.

U.S. Pat. No. 4,916,506, assigned to Sprague Electric Company, discloses a conventional DIP wire bond of a chip to a leadframe wherein each pad on the chip is connected to a finger on the leadframe.

Japanese Kokai 55-164559, assigned to Hitachi Seisakusho K. K. discloses a standard wire bonding technique wire bonding chip pads to fingers on a leadframe wherein the chip is rotated 45° to provide improved wire geometry.

Japanese Kokai 62-123750 to Hitachi discloses a standard DIP package and relates to cutting of the salvage.

Japanese Kokai 1-102945 to NEC Kyushu Ltd. discloses a technique for plating the element mounting part.

Japanese Kokai 59-191360 discloses a double tiered DIP package.

U.S. Pat. No. 3,967,366 to Birglechner, et al. discloses a leadframe tied to a thermal fin which constitutes a part of the leadframe and utilizes a second leadframe stacked on the first leadframe over the top of the chip.

U.S. Pat. No. 4,800,419, to LSI Logic Corporation, discloses a leadframe mounted on the die pedestal.

The article entitled "Thermal Characteristics Of Single and Multi-layer High Performance PQFP Packages" by Aghazadeh, et al. Sixth IEEE; THERM Symposium thermal characteristics of single and multilayer high performance packages.

The article "High Performance PQFP" by Mallik, et al. in IEEE discloses various wire lead configurations, which are aimed at electrical and thermal improvements by the introduction of additional metal planes disclosed U.S. Pat. No. 4,835,120, but does not provide a solution for decreasing chip size and finer wire bond chip pitch.

In net, prior art shows a segment of industry seeking solutions to smaller chips and tighter wire bond pitches; and a second segment seeking solutions to improve thermal and electrical characteristics. The results do not offer an economic technical solution to the composite set of problems. The invention which follows provides a solution to both problems and further extends the technical advantage of the leadframe technology relative to physical dimensions and reliability.

SUMMARY OF THE INVENTION

According to the present invention, an improved chip and leadframe package assembly and method of making the same is provided. The package assembly comprises a metal leadframe having a chip bond pedestal located centrally thereof and a plurality of discrete leads surrounding the pedestal. An I/C (integrated circuit) semiconductor chip is mounted on the pedestal, the chip having a plurality of connection or bonding pads disposed around the periphery thereof. An interposer having a layer of dielectric material and discrete metal lines formed thereon is mounted on an apron of the chip bonding pedestal between the location of the chip and the inner discrete leads of the leadframe. Connections are provided between the bonding pads on the chip and the respective lines on the interposer and connections are also provided between the fingers and the respective lines on the leadframe. Additionally, the interposer also preferably includes at least one voltage bus line formed thereon having a portion adjacent at least one edge of the chip for connection of any of the chip bond pads thereto. Further, the pedestal also preferably includes radially extending conducting arms suitable for providing both electrical ground connection and a heat dissipation path.

DESCRIPTION OF THE PREFERRED EMBODIMENT(S)

Figure 1:
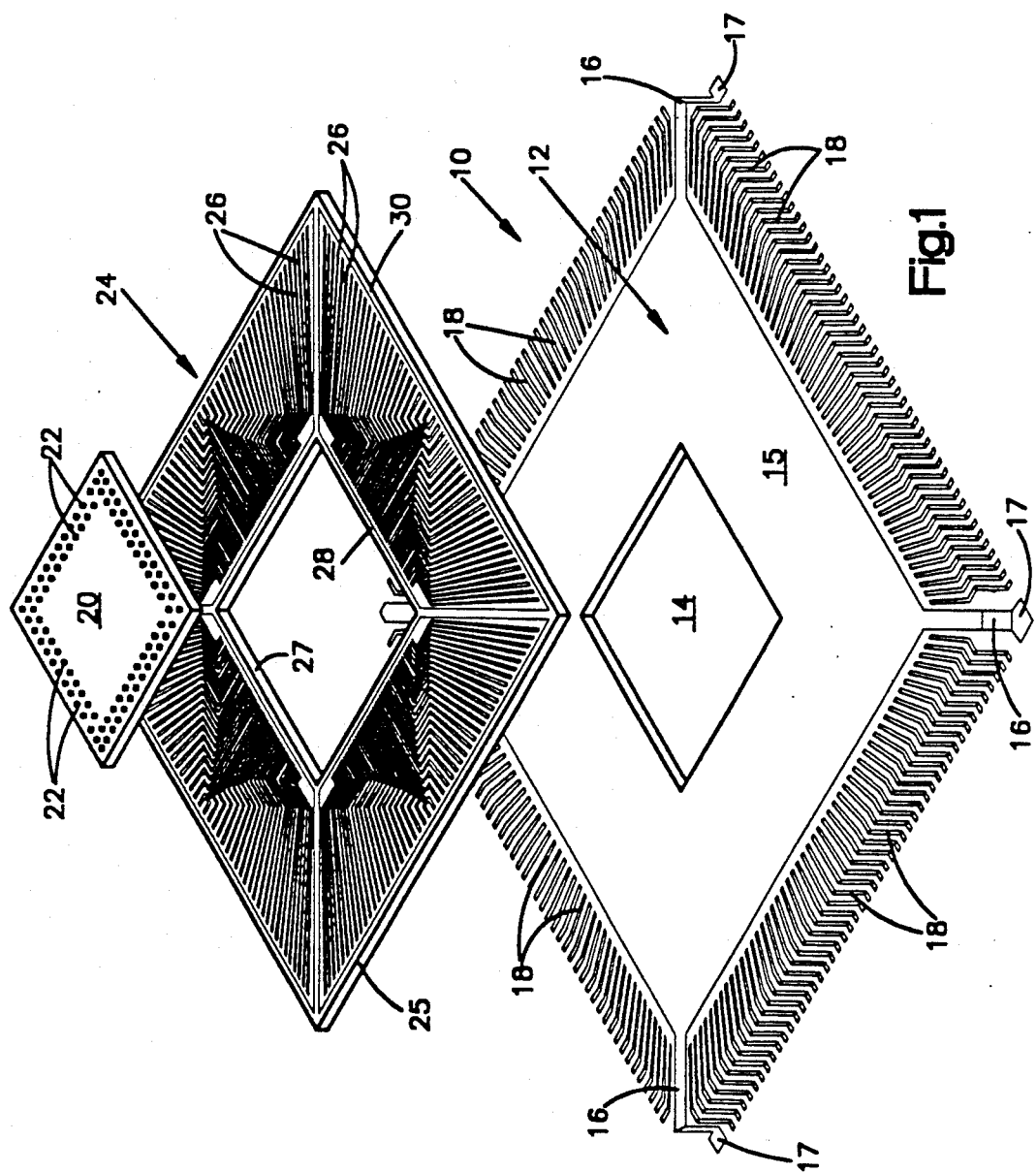
FIG. 1 is an exploded perspective view of a leadframe and interposer and I/C chip package according to the invention.
Figure 2:
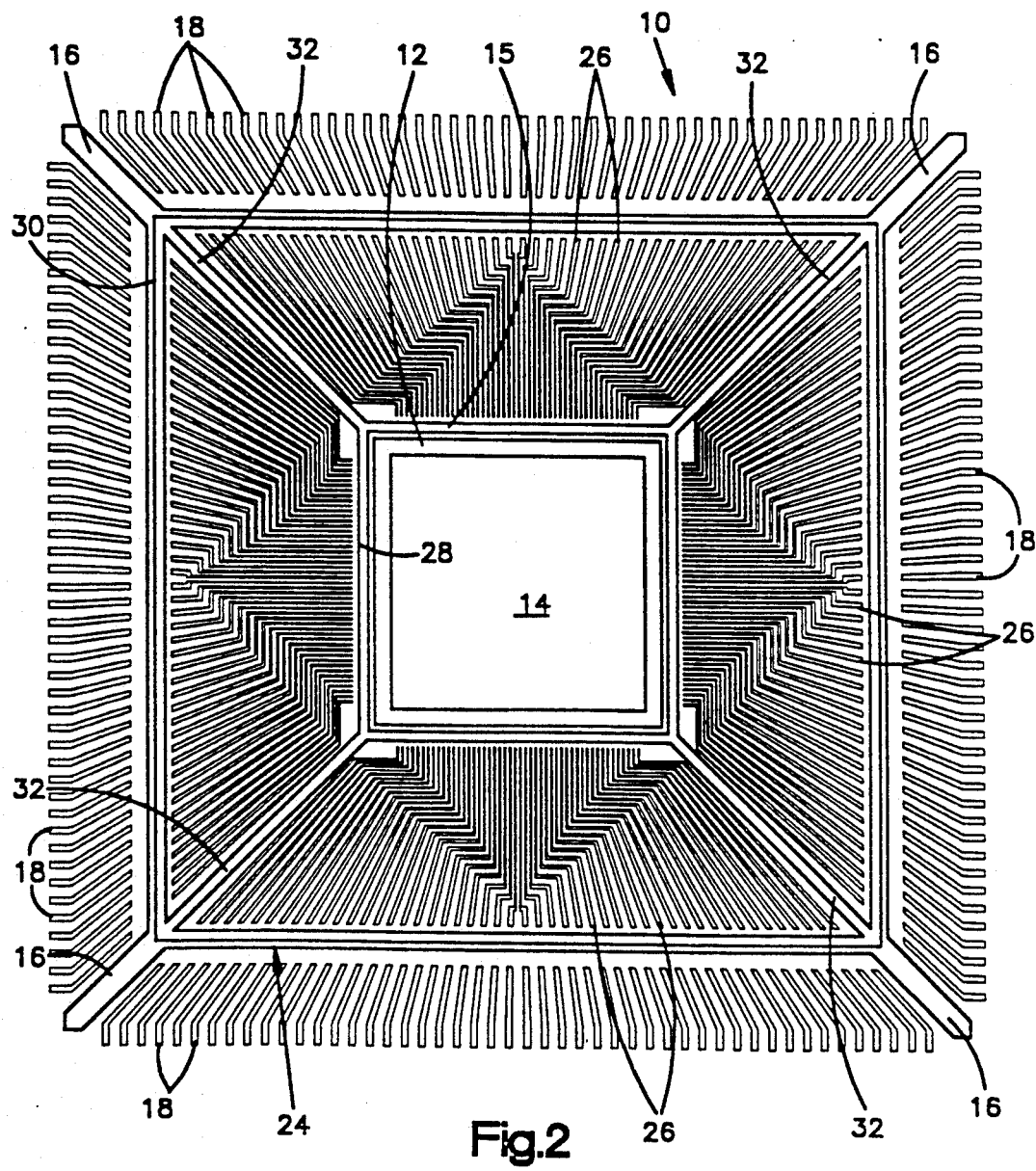
FIG. 2 is a top plan view of a leadframe and interposer used to package an I/C chip according to the invention.

Referring now to the drawings and for the present to FIGS. 1-4, one embodiment of an assembly mounting a I/C (integrated circuit) semiconductor chip on a leadframe with the use of an interposer is shown. According to this invention, a leadframe 10 is provided which is formed of an electrically conducting material such as copper or a copper alloy. The leadframe is formed by any conventional technique such as stamping, or subtractive etching and includes a centrally located chip or die bond pedestal 12. The pedestal 12 is formed with a chip mounting central portion 14 which is surrounded by a raised apron 15. Extending from the apron 15 at the four corners thereof are leg members 16 which have bent feet 17 (FIG. 9) at the ends thereof. The feet 17, together with the legs 16, apron 15, and chip mounting portion 14 of the pedestal 12 serve as heat dissipators or conductors and may also serve as electrical grounds as will be described presently. The leadframe 10 also includes a plurality of interdigitated fingers 18 which are also turned down at their ends to form feet 19 for connection to input/output signal pads and voltage pads on a circuit card (not shown), as will be described presently.

An integrated circuit chip (IC chip) or die 20 (FIGS. 3 and 4) is mounted on the chip mounting portion 14 of the pedestal 12, preferably by means of a heat conducting adhesive 21 of a type conventional in the prior art. Suitable adhesives are typically (70-80% by weight) silver loaded epoxy or polyimide paste.

Figure 3:
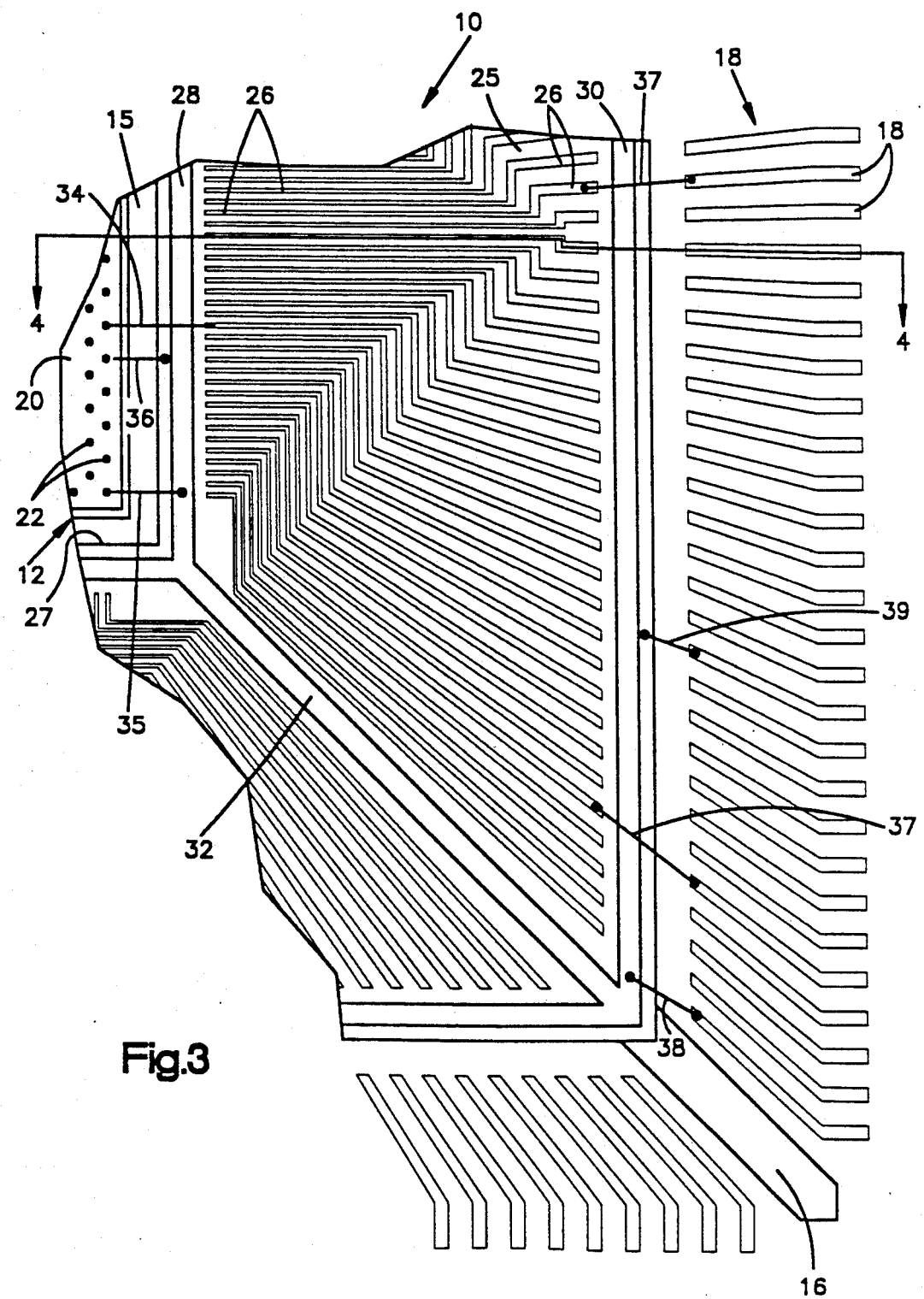
FIG. 3 is a top plan view of a portion of the leadframe as shown in FIG. 2 on an enlarged scale showing a chip mounted thereon.

The IC chip has formed around the outer periphery thereof wire connection pads 22. These pads are conventional type pads and may be formed either as a single row or multiple rows as shown in FIGS. 1 and 3. In any event, these pads provide the necessary signal input/output connection to the devices on the pad as well as providing the necessary voltage level or voltage levels to operate the chip and provide the necessary ground connections where required. Thus, the various pads on the chip provide different types of connections ultimately to a card or board.

As was indicated earlier, there are various different standard sized PFPs which are conventional in the industry. These sizes include 28 mm square, 32 mm square, 36 mm square, and 40 mm square. Of course, these are just examples and other sizes may be used but these are conventional sizes readily available. Also as was indicated earlier, when chips are designed, different connection pads may be assigned as signal pads or voltage pads or ground pads and it has been conventional prior art practice to provide interdigitated fingers on the leadframe to connect with these various pads. It has also been conventional prior art practice to have "dedicated" or "designated" ones of these fingers as signal lines and as voltage lines and as ground lines on standardized PFP applications. The prior art does not provide for convenient cross over wiring from pads which are not directly aligned with the fingers in the leadframe. Therefore, in the leadframe design, the configuration or dedication of particular pads as ground pads and voltage line has required certain of the pads physically on the chips to be designed to match them as voltage lines and ground lines. This adds additional limitations and restrictions to the design of various chips for whatever size. A further constraint of this type of packaging of leadframe and chip is that the even though only one or very limited of number of voltage levels are required, a separate connection finger is required for each of the pads on the chip which requires such a voltage or ground level and thus, many of the fingers which are provided on the leadframe are carrying identical levels of voltage or are tied to ground because of the configuration. For this reason, the number of fingers available for I/O signals is reduced.

Moreover, with stamping technology it becomes very difficult to form the lead fingers small enough and yet with sufficient separation to approach into close proximity with the chip. Hence, in order to get the requisite number of fingers in the leadframe to connect with each of the pads, it is necessary to terminate them a relatively long distance away from the chip, which then requires interconnection over this distance between the chip and the lead fingers. As indicated above, this can be with wire bonding but if it is a long run such a connection is difficult to properly achieve.

Thus, according to the present invention, an interposer 24 is mounted on the apron 15 of the pedestal 12 between the chip 20 and the fingers 18. The interposer is comprised of a rectilinear layer dielectric material 25 such as a polyimide on which signal lines 26 are formed such as by etching. The signal lines are formed of copper or other conducting material. The interposer 24 has a central window or opening 27 giving it the shape of a "window frame".

The signal lines 26 are formed in an interdigitated pattern and arranged to connect with any of the I/O signal pads 22 on the chip 20. These lines are centrally located on the dielectric material 25 and spaced both from the inner and outer edges thereof for a purpose which will be described presently.

Also formed on the dielectric material 25 is an inner voltage bus 28 and an outer voltage bus 30. The inner voltage bus is a continuous rectangular ring disposed on the dielectric material 25 and spaced between the inner edge thereof and the inner termination of the signal lead lines 26. The outer voltage bus 30 is also rectangular in shape and spaced between the outer edges of the signal lead lines 26 and the outer edge of the dielectric material 25. Four bus connectors 32 are provided around the dielectric material 25 which provide interconnection between the inner voltage bus 28 and the outer voltage bus 30.

The interposer 24 is secured, preferably by adhesive bonding, onto the apron 15. Thus, with this type of wiring configuration of the inner and outer voltage buses on the interposer, any pad on the chip can be wired directly to the inner voltage bus 30 and thus no specific fingers need to be "dedicated" to a particular voltage. Moreover, any finger 18 can be wired to the outer voltage bus 30, and thus no specific finger need be dedicated to the voltage supply function. Hence, any of the lines 26 or associated fingers 18 can be utilized as signal I/O lines and none need be required for the repetitive or redundant function of carrying voltage to different pads. These types of connections are shown in FIGS. 3 and 4.

Figure 4:
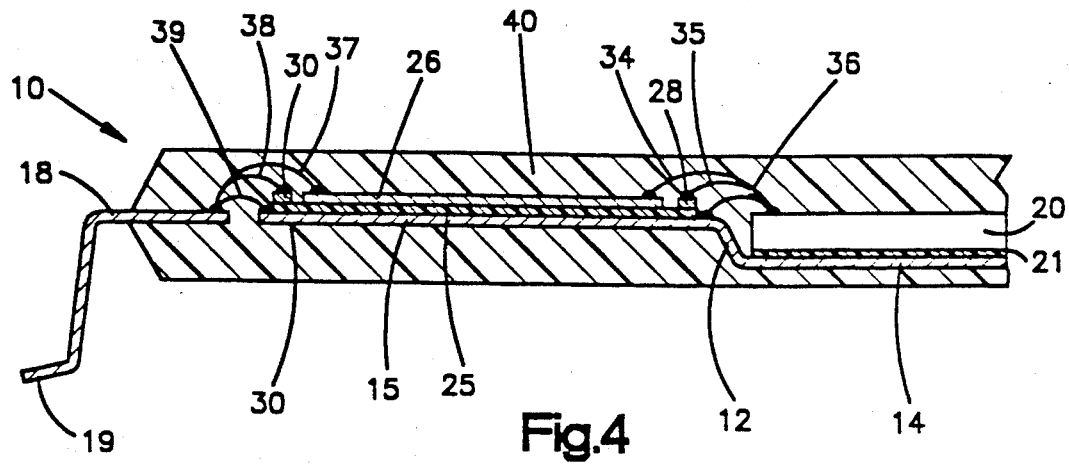
FIG. 4 is a partial sectional view taken substantially along the plane designated by the line 4—4 of FIG. 3.

As shown in FIGS. 3 and 4, wires 34 connect the various signal pads 22 on the chip 20 to the associated respective signal lead line 26 with the wires arching or bridging over the inner voltage bus 28. The selected wire connection pads 22 on the IC chip 20 which are to be voltage pads are wired by means of wires 35 to the voltage bus 28. Moreover, the connection pads 22 on the chip 20 that are to be at ground level are wired by connector wires 36 directly to the apron 15 of the pedestal which also surrounds the chip and is exposed between the central opening 27 of the interposed 24 and the chip 20 so that the ground connection can be made directly thereto. Correspondingly outer wires 37 connect the respective fingers 18 to the respective signal lead lines 26, and wires 38 connect the outer voltage bus 30 to fingers 18. The feet 17 of legs 16 may be connected directly to ground if such a connection is available on the card at the location of the feet 17. If such ground is available on the card only at one or more locations of the feet 19 of the fingers 18 and not at the location of any of the feet 17, then the outer portion of the apron 15 can be connected by wires 39 to the required finger or fingers 18 can be connected directly to apron 15.

Figure 9:
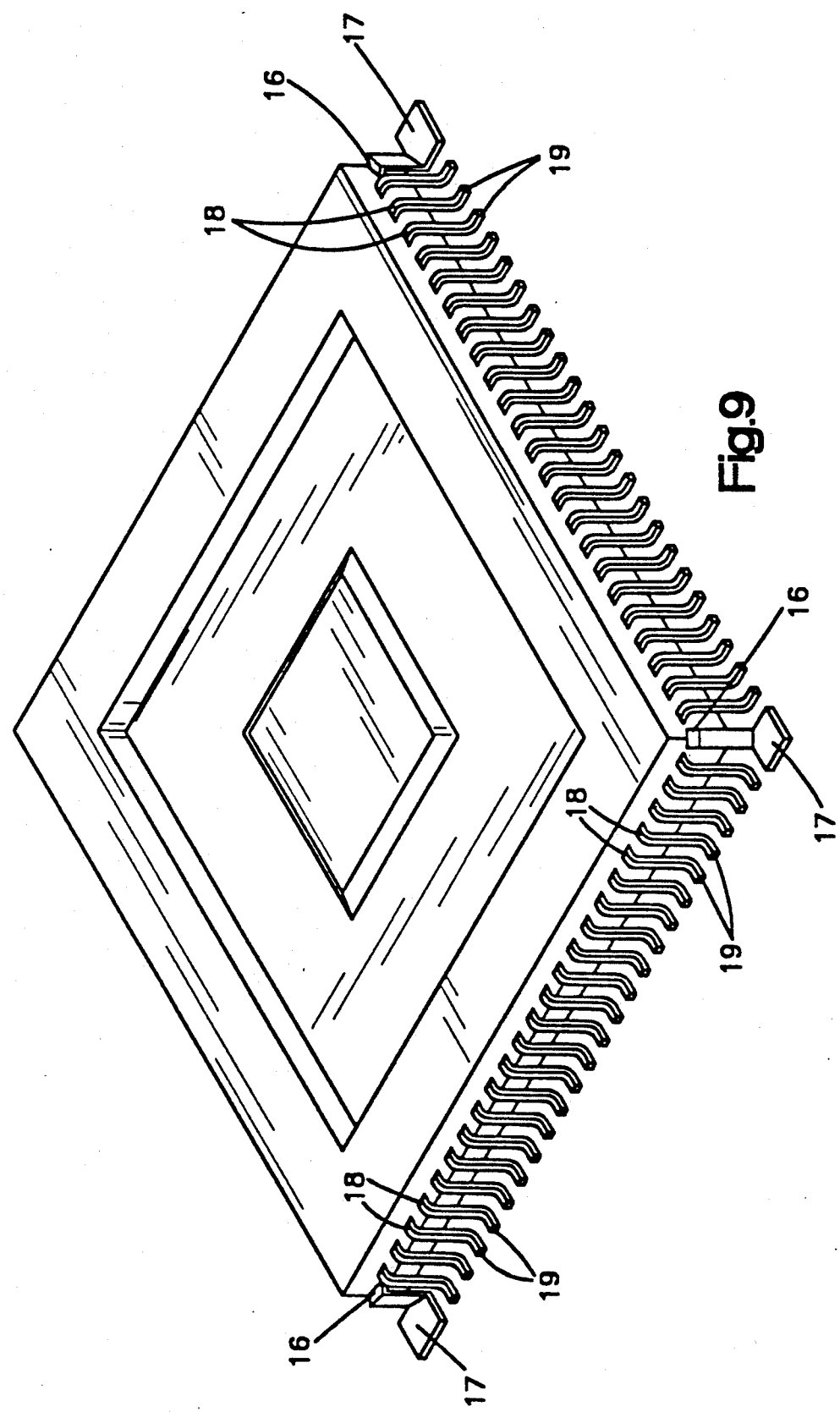
FIG. 9 is a perspective view of the encapsulated assembly formed according to this invention.

The entire package is then encapsulated in a plastic such as a plastic, e.g. an epoxy 40 by conventional means. Various types of conventional molding machines can be utilized for encapsulation. For example various models (e.g. 140, 280, 480, and brilliant 100) of molding machines manufactured by FICO Corp. of the Netherlands may be used, and employing the proper molds to provide the desired finished product. ASM Electronic materials Handbook, Vol. 1, published in 1989 at pages 472 and 473 describes transfer molding techniques that can be utilized to practice this invention. Because of the short wire runs as described above, "wire wash" or "wire sweep" by the molding plastic is not a significant problem. The final product after it is encapsulated is shown in FIG. 9.

Figure 8A:
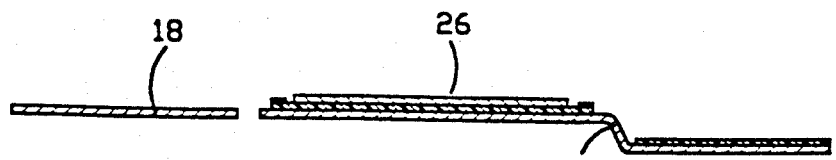
FIGS. 8A-8G are longitudinal sectional views somewhat diagrammatic showing the sequence of steps in forming one embodiment of the present invention.
Figure 8B:
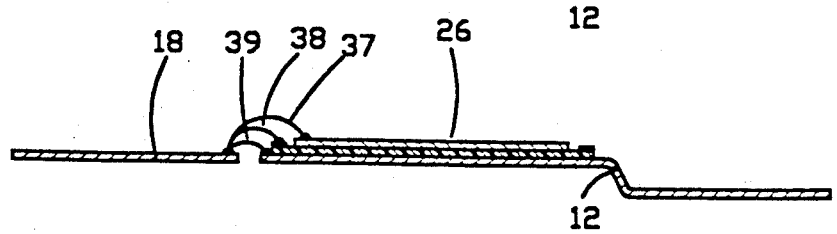
Figure 8C:
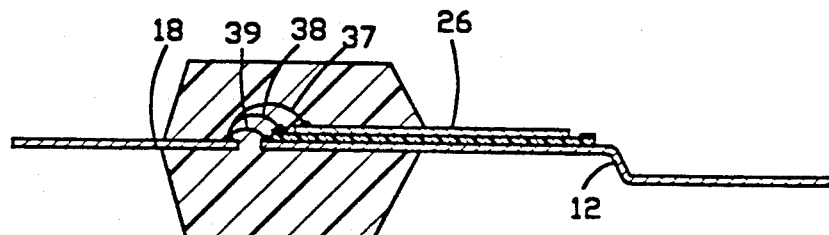
Figure 8D:
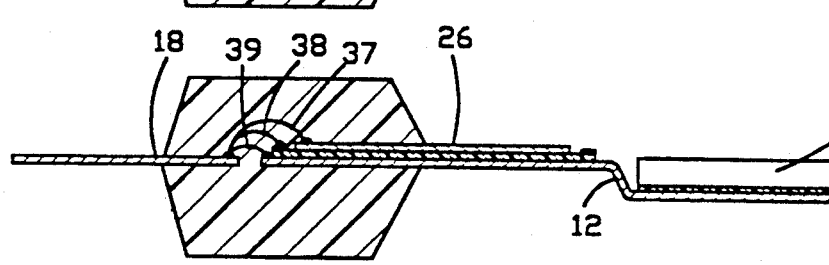
Figure 8E:
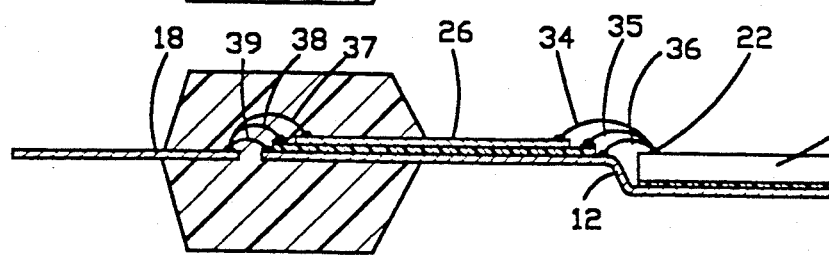
Figure 8F:
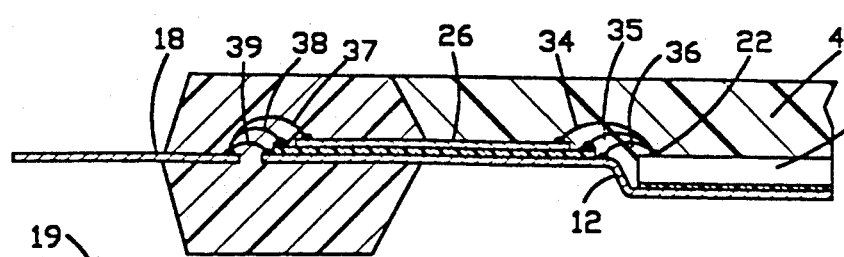
Figure 8G:
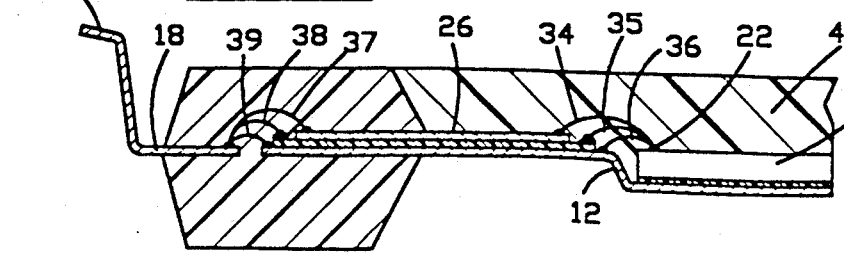

Alternatively and in order to achieve a thinner profile, a somewhat modified version of the configuration of the legs 16 and fingers 18 and an encapsulation technique can be employed This is depicted in FIGS. 8A-8F. As shown in FIGS. 8A-8G, interposer is attached to the apron of the leadframe as shown in FIG. 8A. The wire bonding of wires 37 and 38 between the leadframe and the various fingers is then accomplished as shown in FIG. 8B. It will be noted that in this configuration, the feet 17 of legs 16 and feet 19 of fingers 18 are bent in the opposite direction as those shown in FIGS. 1 and 4, thus maintaining the chip "upside down". This wire bonded region is then encapsulated in an encapsulating material 42 as shown in FIG. 8C. Following this, the chip 20 is attached to the pedestal 12 as shown in FIG. 8D, and then the various wires 34, 35 and 36 are attached from the chip pads 22 to the signal lines 26 as shown in FIG. 8E. Following this, a technique known as "glop topping" is employed to encapsulate just the top surface of the chip pedestal 12, the IC chip 20, and the wires 34, 35, and 36 bonding the chip to the lead lines 26 with a plastic 44. This "glop topping" can be accomplished with a variety of conformal coatings of low viscosity epoxies, silica-modified epoxies and silicone materials conventionally used for tape automated bonding (TAB) structures.

The "glop topping" is especially effective not only to provide for a thinner configuration of the final package assembly but also to allow for the provision of a heat sink to increase the heat dissipation. It has the further advantage of permitting larger package body sizes without the reliability limitations inherent in injection molding where a key requirement to prevent fatigue cracking is a thermal expansion match of the plastic to the silicon chip. There is a further advantage in conforming coating of minimizing wire wash.

Figure 5:
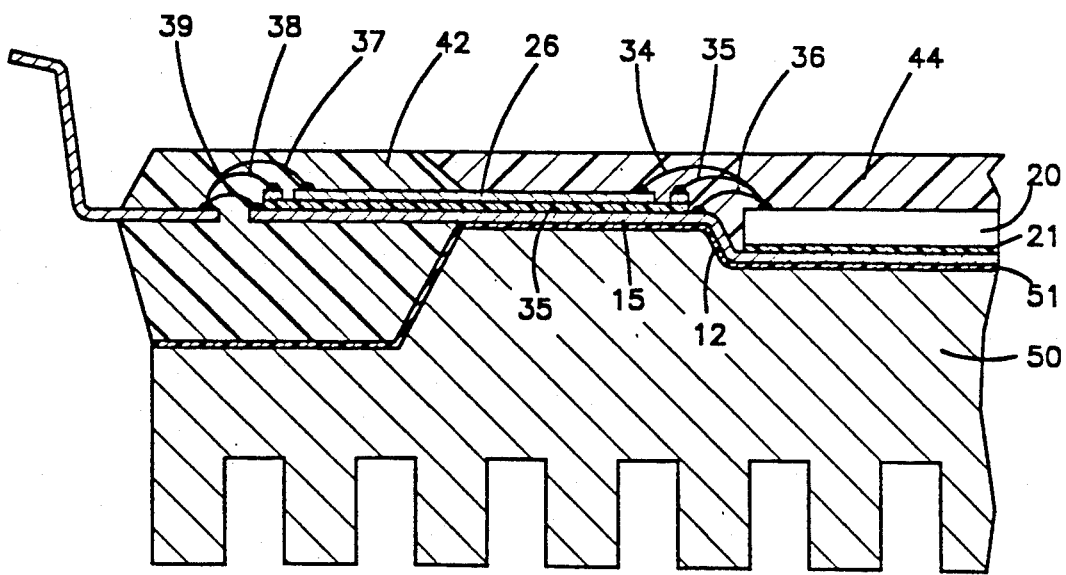
FIG. 5 is a partial sectional view similar to FIG. 4 of another embodiment of the present invention.
Figure 6:
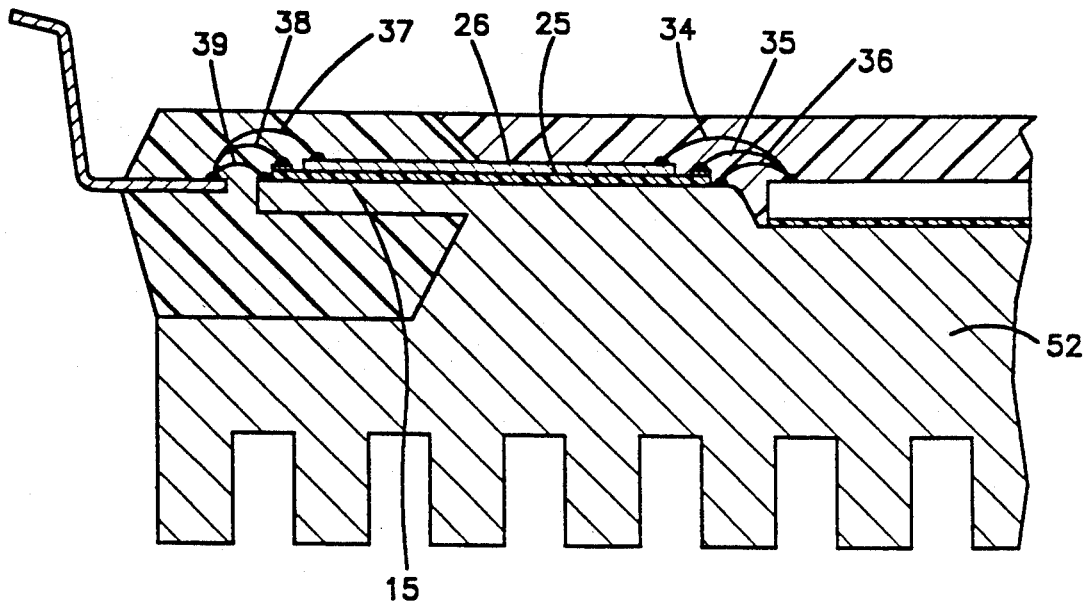
FIG. 6 is a partial sectional view similar to FIG. 4 of yet another embodiment of the present invention.

As indicated above, the legs 16 from the apron 15 do act as heat dissipation means when they are attached to a card or board. However, as the number of devices which can be formed on a chip increases, and thus the amount of heat increases, increased heat dissipation may be required over and above what can be accomplished by just the legs 16 attached to the apron 15. To this end, a heat sink 50 as shown in FIG. 5 can be bonded by adhesive 51 to the final product; or, as shown in FIG. 6, a modified pedestal portion 52 of the leadframe can be formed as a heat sink integrally therewith.

In some instances it may be desirable to provide more than one level of voltage to a chip. This can be accomplished in several ways. One way is to form the inner and outer voltage buses 28 and 30 in two or more separate sections and provide different voltage levels to each section. Thus, if two different voltages are required, one section of the voltage bus can supply one voltage level to two different sides of the chip and another section can supply another level of voltage to the two other sides of the chip. This has the limitation of requiring the chip designer to provide the required voltage pads on the chip at the specific edges of the chip where such voltage is available and thus limits somewhat the freedom of design of the chip designer.

Figure 7:
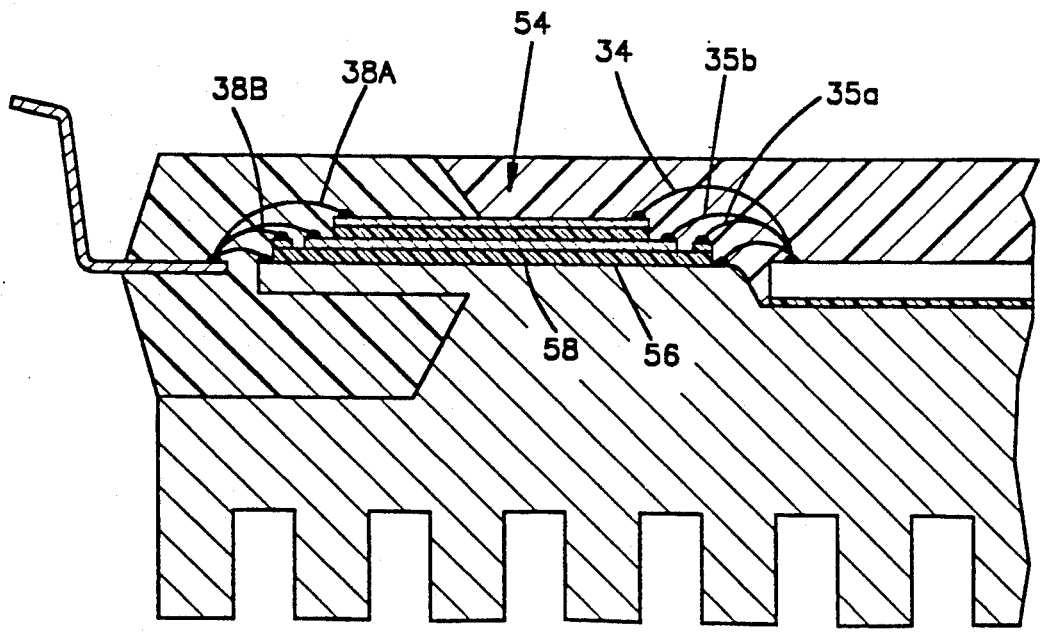
FIG. 7 is partial sectional view similar to FIG. 4 of still another embodiment of this invention.

Another technique of providing multiple voltages is shown in FIG. 7. In this embodiment, an interposer 54 is provided with a separate layer of a dielectric material 56 having a layer of metallization 58. With the material 56 adhesive bonded over previously described interposer 24 such that the inner bus 28 and outer bus 30, as well as some portion of the signal lines 26, extend beyond the interposer 54 so as to provide bonding areas. This provides a second or additional contact for supplying voltage to the chip from the fingers 18. Those pads 22 which require one voltage are connected to this metalization, 58 by wires 35a while the pads 22 that require a separate voltage layer are connected to the inner voltage bus 28 by wires 35b. Of course, additional layers could be provided for additional levels of voltage as necessary. Similarly, the metalization layer 58 is connected to a finger or group of fingers 18 by wires 38a for one voltage and the outer bus 30 is connected by wires 38b to another finger or set of fingers 18 for the other voltage level.

It is also to be understood that certain changes or modifications can be made to the embodiments as disclosed. For example, if one wishes to avoid wire bonding, it is possible to form the fingers 18 on the interposer with extensions which extend either over the chip 20, or over the fingers 18, or both, so that direct contact can be made between the lines 26 and the pads 22 and/or the fingers 18.

Although several embodiments of this invention have been shown and described, various adaptations and modifications can be made without departing from the scope of the invention as defined in the appended claims.

What is claimed is:

1. A leadframe and integrated circuit chip package assembly comprising:
   a leadframe formed of an electrically and thermally conducting material and having a pedestal located centrally thereof and a plurality of interdigitated electrically conducting fingers arrayed therearound and spaced therefrom;
   said pedestal having a chip mounting portion with an apron therearound;
   an integrated circuit chip mounted directly on said chip mounting portion with one face thereof in a thermally conducting relationship therewith;
   said chip having a plurality of connection pads disposed around the periphery thereof on the face thereof opposite the face in thermally conducting relationship with the pedestal;
   an interposer having a layer of dielectric material mounted on said apron between the chip and the fingers and spaced from said chip;
   said interposer having a plurality of interdigitated electrically conducting lines formed on the surface thereof;
   first connection means interconnecting the pads on the chip with respective lines on the interposer; and
   second connection means connecting the fingers with respective lines on the interposer.

2. The package assembly as defined in claim 1 further characterized by voltage bus means formed on said interposer, a portion of said bus means extending transversely with respect to the lines on the interposer and at least partially surrounding said chip.

3. The package assembly as defined in claim 2 wherein said portion of said voltage bus means completely surrounds said chip.

4. The package assembly as defined in claim 2 wherein said voltage bus means includes at least two electrical isolated segments, each of which can be maintained at a voltage independent of the other.

5. The package assembly as defined in claim 4 wherein said two segments are in the same plane, and each partially surrounds the chip.

6. The package assembly as defined in claim 4 wherein said two segments are disposed on superimposed planes.

7. The package assembly as defined in claim 1 wherein said apron is a ground plane, and wherein the pads on said chip includes ground pads which are connected to said apron.

8. The package assembly as defined in claim 7 further characterized by extension means connected to said apron to provide ground connection thereto.

9. The package assembly as defined in claim 8 wherein said fingers and said extension means both includes feet portions disposed to connect to a circuit card.

10. The package assembly as defined in claim 1 further characterized by heat dissipating means associated with said pedestal.

11. The package assembly as defined in claim 10 wherein said heat dissipating means includes leg means connected to said pedestal and disposed to contact a circuit card.

12. The package assembly as defined in claim 1 wherein said heat dissipating means includes heat sink means operatively associated with said pedestal.

13. A method of forming a leadframe and integrated circuit chip package assembly comprising the steps of:
   forming a leadframe of an electrical and thermally conducting material having a pedestal located centrally thereof and a plurality of interdigitated electrically conducting fingers arrayed therearound and spaced therefrom;
   said pedestal having a chip mounting portion with an apron therearound;
   mounting an integrated circuit chip directly on said chip mounting portion with one face thereof in thermally conducting relationship therewith;
   said chip having a plurality of connection pads disposed around the periphery thereof on the face thereof opposite the face in thermally conducting relationship with the pedestal;
   forming an interposer having a layer of dielectric material;
   said interposer having a plurality of interdigitated electrically conducting lines formed on the surface thereof on;
   mounting said interposer on said apron between the chip and the fingers and spaced from said chip;
   forming first connections between the pads on the chip and respective lines on the interposer; and forming second connections between the fingers and respective lines on the interposer.

14. The method as defined in claim 13 further characterized by forming voltage bus means on said interposer, a portion of said bus means extending transversely with respect to the lines on the interposer and at least partially surrounding said chip.

15. The package assembly as defined in claim 14 wherein said portion of said voltage bus means completely surrounds said chip.

16. The method as defined in claim 14 wherein said voltage bus means includes at least two electrical isolated segments, each of which can be maintained at a voltage independent of the other.

17. The package assembly as defined in claim 16 wherein said two segments are formed in the same plane, and each partially surrounds the chip.

18. The method as defined in claim 16 wherein said two segments are formed on superimposed planes.

19. The method as defined in claim 13 wherein said apron is a ground plane, and wherein the pads on said chip include ground pads which are connected to said apron.

20. The method as defined in claim 19 further characterized by forming extension means from said apron to provide ground connection thereto.

21. The method as defined in claim 20 wherein said fingers and said extension means both are formed with feet portions disposed to connect to a circuit card.

22. The method as defined in claim 13 further characterized by providing heat dissipating means associated with said pedestal.

23. The method as defined in claim 22 wherein said heat dissipating means are formed of leg means connected to said pedestal and disposed to contact a circuit card.

24. The method as defined in claim 13 wherein said heat dissipating means includes forming heat sink means operatively associated with said pedestal.

25. The method as defined in claim 24 wherein said heat sink means are formed as a separate element and connected to said pedestal.

26. The package assembly as defined in claim 1 further characterized by encapsulating means encapsulating said chip and said first and second connection means.

27. The method as defined in claim 13 further characterized by encapsulating said chip and said connection.

28. The method as defined in claim 27 wherein said encapsulation takes place in two steps, one step to encapsulate the chip and the connection between the chip and the electrical conducting lines and another step to encapsulate the connection between the fingers and the electrical conducting lines.

* * * * *